United States Patent [19]

Schmitz

[11] Patent Number: 5,103,075

[45] Date of Patent: Apr. 7, 1992

[54] PROCESS FOR THE ADJUSTMENT OF ELECTRONIC CIRCUITS

[75] Inventor: Günter Schmitz, Aachen, Fed. Rep. of Germany

[73] Assignee: FEV Motorentechnik GmbH & Co KG, Aachen, Fed. Rep. of Germany

[21] Appl. No.: 551,175

[22] Filed: Jul. 11, 1990

[30] Foreign Application Priority Data

Jul. 13, 1989 [EP] European Pat. Off. ........ 89112816.7

[51] Int. Cl.⁵ .............................................. B23K 26/00
[52] U.S. Cl. ........................... 219/121.69; 219/121.83
[58] Field of Search ........... 219/121.6, 121.61, 121.62, 219/121.69, 121.68, 121.83

[56] References Cited

U.S. PATENT DOCUMENTS 4,284,872  8/1981  Graeme .......................... 219/121.65
4,381,441  4/1983  Desmarias et al. ............. 219/121.65

FOREIGN PATENT DOCUMENTS

0084247A3  12/1982  European Pat. Off. .
0219386A1   9/1986  European Pat. Off. .
2054301     2/1981  United Kingdom .
2197957     6/1988  United Kingdom .

Primary Examiner—C. L. Albritton
Attorney, Agent, or Firm—Watson, Cole, Grindle & Watson

[57] ABSTRACT

A process for the adjustment of electronic circuits, which have one or more resistors and one or more processors, is improved so that it is especially flexible and cost-effective. This is achieved in that at least one parameter required for the respective application is impressed on at least one processor by adjusting at least one resistor, whose adjustment is read in via an analog/-digital converter through a processor.

18 Claims, 1 Drawing Sheet

PROCESS FOR THE ADJUSTMENT OF ELECTRONIC CIRCUITS

RELATED APPLICATIONS

The present application relates to commonly owned U.S. patent applications Ser. No. 391,248, filed Aug. 9, 1989 and Ser. No. 329,839, filed Mar. 23, 1989; Ser. No. 446,781, filed Dec. 6, 1989; Ser. No. 446,726, filed Dec. 8, 1989; Ser. No. 446,780, filed Dec. 6, 1989; Ser. No. 446,728, filed Dec. 6, 1989; Ser. No. 535,536, filed June 11, 1990; and Ser. No. 535,062, filed June 8, 1990, which are hereby incorporated by reference.

BACKGROUND OF THE INVENTION

1. Technical Field of the Invention

The present invention relates to a process to adjust electronic circuits which contain one or more resistors and one or more processors.

2. Discussion of the Related Art

In numerous electronic circuits it is necessary to balance each fabricated specimen separately to correct the permissible variation of the component and also to tune each fabricated specimen to specific requirements. To this end, one or more electronic components such as capacitors are frequently balanced.

In electronic circuits which have a processor, the expense can be reduced with the use of electronically programmable components such as PROM or EPROM by adapting each specimen by programming in corresponding parameters (end-of-line-programming). Of course, this requires the presence of such individually programmable components whose costs are clearly above those of a, e.g., mask programmed component.

The invention is based on the problem of also enabling a cost-efficient and flexible programming with the exclusive use of permanent program storage such as mask programmable ROMs.

Other objects and advantages are apparent from the specification and drawing which follow.

SUMMARY OF THE INVENTION

According to the invention, it is provided in a process of the aforementioned kind that at least one parameter required for the respective application is impressed on at least one processor by adjusting at least one resistor, those adjustment is read in via an analog/digital converter by means of a processor.

Due to the especially simple resistor balancing, it is possible to "program" the parameters which the processor can access in a manner analogous to that of the PROM solution.

BRIEF DESCRIPTION OF THE DRAWINGS

Embodiments of the invention are described with reference to the drawings, wherein.

DETAILED DESCRIPTION OF THE PREFERRED EMBODIMENTS

Figure 1:
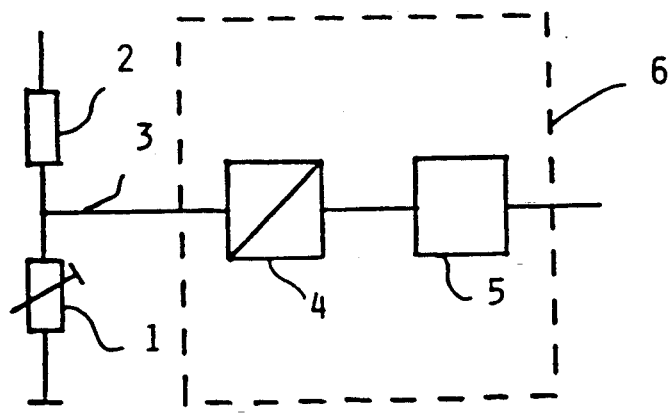
FIG. 1 shows a circuit to carry out the process.

Referring to FIG. 1, a voltage divider is formed by resistors 1 and 2 and has an output voltage which is passed on line 3 via an analog/digital converter 4 to processor 5 to read in. Special advantages with respect to cost-effective actualization can be obtained if analog/digital converter 4 is integrated with processor 5 together into a micro-controller 6.

Advantages with respect to a direct balancing of the electronic circuit can be obtained if an expensive iterative adjusting procedure is eliminated by considering with a formula the adjusted parameters or if in this manner an expensive adjustment can be replaced with trimming capacitors.

Figure 2:
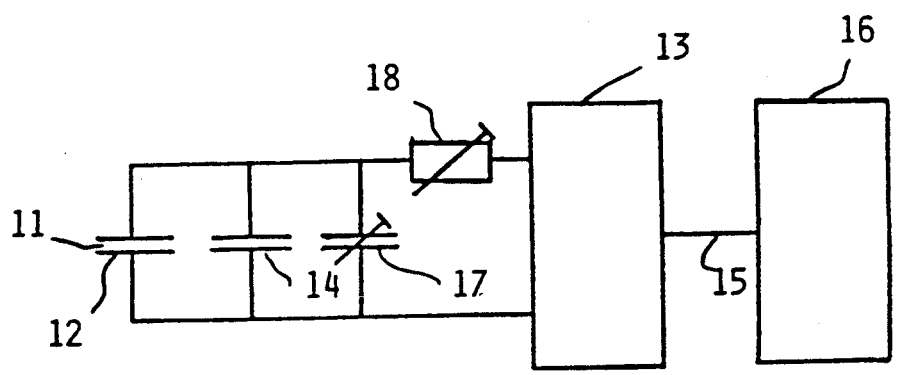
FIGS. 2 and 3 show circuits to measure the relative permittivity of an unknown medium.

FIG. 2 shows as an example a circuit to measure the relative permittivity of an unknown medium, the medium forming the dielectric material 11 of capacitor 12 which in turn is the frequency-determining element in a RC oscillator, circuit 13. Both capacitance 12 that is dependent on the relative permittivity and the parasitic capacitance 14 that is independent of the relative permittivity fluctuate owing to the manufacturing dispersion. In order to be able to balance at this stage the output frequency on line 15, which is fed to a further processing circuit 16, over the entire measurement range, it is necessary to balance with the aid of two adjustable components, namely, with a parallel capacitor 17 and a trimming resistor 18. The balancing can be performed only via an iterative process. The precision capacitor is filled alternatingly with mediums having different relative permittivities and a balancing of the capacitor 17 is set in the presence of a low relative permittivity and resistor trimmer 18 is set in the presence of a medium with a high relative permittivity. These steps are repeated until the adjustment no longer yields any distinct improvement.

Figure 3:
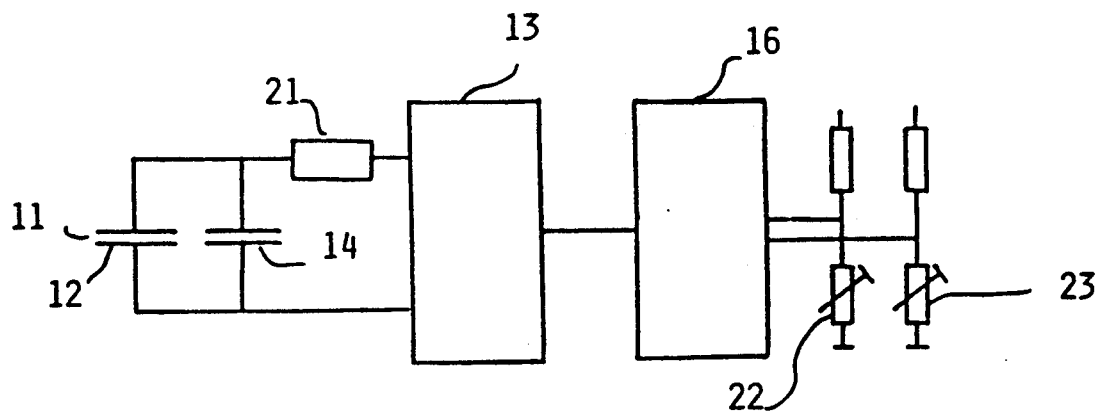

In the embodiment of FIG. 3, the process of the invention is used. In this case the trimming capacitor 17 (FIG. 2) can be dispensed with and the trimming resistor 18 (FIG. 2) can be converted into a fixed resistor 21. At this stage the balancing is conducted in such a manner that a frequency measurement is performed once with the medium of lower relative permittivity (e.g., air) and a second measurement with a medium of an especially high relative permittivity. The result of the frequency measurement is fed into the processor by trimming two resistors 22 and 23 so that in a future operation it can compensate for the mass production dispersion with a corresponding formula consideration.

For mass production, special advantages can be obtained through the use of a resistor-laser-trimming process which involves balancing by partially burning away the resistance paths. This process is not possible in the conventional technology for two reasons. First, there is no logical possibility of balancing a capacitor through laser trimming, and secondly, owing to the irreversible process of burning, an iterative balancing with laser trimming is not possible.

Similarly the process on which the invention is based can be used in an advantageous manner to adapt each specimen of a series to the specific case of application. Thus, the output characteristics can be selected, for example, by coding with different analog values.

Furthermore, a component that can be programmed individually can be economically utilized by programming it with of a series number, batch number, a product type identification or for the implementation of software protection in that the parameters are adjusted in, turn by resistor trimming making available the resistor value via an A/D converter consoled to an input of the processor.

The use of this entire process is especially advantageous in hybrid engineering, where in particular laser trimming begins to bear fruit. Such hybrid circuits can be integrated in an especially advantageous manner in the housings of sensors which make available a directly further usable signal by compensating for the type dispersion and, e.g., adapting the output characteristics of the sensors by means of the processor to the specific application.

Though the present invention has been described with reference to specific preferred embodiments, further modifications and improvements will be apparent to one skilled in the art without departing from the spirit and scope of the present invention as described in the following claims.

I claim:

1. A process for adjusting an electronic circuit which contains at least one resistor and at least one processor, comprising the stems of:
   adjusting at least one resistor representative of at least one parameter required for a respective application of at least one processor, and
   reading the value of the adjusted resistor into the processor via an analog/digital converter at an input of said processor.

2. The process according to claim 1, wherein said at least one parameter represents a resistor value to compensate for mass product variations.

3. The process according to claim 1, wherein at least one parameter represents resistor values each corresponding to different applications.

4. The process according to claim 3, wherein at least one parameter represents resistor values each used to identify the circuit and is selected from the group consisting of series number, batch number, product type and software protection of the circuit.

5. The process according to claim 1, wherein said adjusting step comprises laser trimming at least one resistor.

6. The process according to claim 2, wherein said adjusting step comprises laser trimming at least one resistor.

7. The process according to claim 3, wherein said adjusting step comprises laser trimming at least one resistor.

8. The process according to claim 4, wherein said adjusting step comprises laser trimming at least one resistor.

9. The process according to claim 1, wherein at least one parameter is processed by means of a formula stored in the processor.

10. The process according to claim 2, wherein at least one parameter is processed by means of a formula stored in the processor.

11. The process according to claim 3, wherein at least one parameter is processed by means of a formula stored in the processor.

12. The process according to claim 4, wherein at least one parameter is processed by means of a formula stored in the processor.

13. The process according to claim 5, wherein at least one parameter is processed by means of a formula stored in the processor.

14. The process according to claim 6, wherein at least one parameter is processed by means of a formula stored in the processor.

15. The process according to claim 7, wherein at least one parameter is processed by means of a formula stored in the processor.

16. The process according to claim 8, wherein at least one parameter is processed by means of a formula stored in the processor.

17. The process according to any of claims 1-16, wherein the electronic circuit is connected and housed within sensor in a common housing.

18. A process for adjusting an electronic circuit employing a processor adapted for selected applications, a trimmable resistor and an A/D converter coupled between the resistor and an input of the processor comprising the steps of:
   selectively trimming the resistor for establishing an analog value thereof representative of a parameter corresponding to a particular application to which the processor is adapted and reading the analog value of the resistor into the processor by means of the A/D converter.

* * * * *